United States Patent [19]

Yoshida et al.

[11] Patent Number: 5,089,468
[45] Date of Patent: Feb. 18, 1992

[54] PROCESS FOR PRODUCING BISMUTH-BASED SUPERCONDUCTING OXIDE

[75] Inventors: Hitoshi Yoshida, Okazaki; Hitoshi Sakai, Komaki; Shuichiro Oki, Aichi; Keiichiro Watanabe, Nagoya; Manabu Yoshida, Bisai; Toshio Oda, Nagoya, all of Japan

[73] Assignee: NGK Insulators, Ltd., Nagoya, Japan

[21] Appl. No.: 501,723

[22] Filed: Mar. 28, 1990

[30] Foreign Application Priority Data

Mar. 30, 1989 [JP] Japan .................... 1-79521
Sep. 28, 1989 [JP] Japan .................... 1-253530
Dec. 28, 1989 [JP] Japan .................... 1-342457
Dec. 28, 1989 [JP] Japan .................... 1-342458

[51] Int. Cl.$^5$ .......................... H01L 39/12
[52] U.S. Cl. .......................... 505/1; 264/332; 427/62; 427/376.2; 505/741; 505/742
[58] Field of Search .......... 505/1, 742, 782, 725, 505/733, 739, 741; 264/65, 332; 427/62, 376.1, 376.2

[56] References Cited

FOREIGN PATENT DOCUMENTS

0369464 5/1990 European Pat. Off. .
1-201060 8/1989 Japan .
1-203257 8/1989 Japan .
1-226735 9/1989 Japan .

OTHER PUBLICATIONS

A. Ono, "Crystallization of 107K Superconducting Phase and Partial Melting in the Bi-(Pb)-Sr-Ca-Cu-O System", *Japanese Journal of Applied Physics*, vol. 27, No. 12, pp. 2276-2279 (1988).

Zonatto et al., "Melt Processing of Bi-Ca-Sr-Ca-O Superconductors", *Ceramic Superconductors II*, pp. 406-418.

S. Jin et al, *Appl. Phys. Lett.* 52, 1628-30, "Superconductivity in the Bi-Sr-Ca-Cu-O Compounds with Noble Metal Additions", (May 9, 1988).

T. Komatsu et al, *IEEE Transactions on Magnetics*, 25, 2150-2153, "High-T$_c$ Superconcucting Glass Ceramics Based on the Bi-Ca-Sr-Cu-O System", (Mar. 1989).

Primary Examiner—Jan H. Silbaugh
Assistant Examiner—Christopher A. Fiorilla
Attorney, Agent, or Firm—Armstrong, Nikaido, Marmelstein, Kubovcik & Murray

[57] ABSTRACT

The present process for producing a Bi-based superconducting oxide includes the steps of molding a material powder and subjecting the molded article to partial melting and then to crystallization in the presence of oxygen. In that case, the molded article is annealed, after the partial melting, to the crystallization temperature and subjected to crystallization at that temperature. Also, the article after the crystallization is cooled and the cooled article is heat-treated in an inert gas atmosphere. According to the above process, there can be obtained a Bi-based superconducting oxide having excellent superconducting properties.

6 Claims, No Drawings

PROCESS FOR PRODUCING BISMUTH-BASED SUPERCONDUCTING OXIDE

BACKGROUND OF THE INVENTION AND RELATED ART STATEMENT

The present invention relates to a process for producing a bismuth-based superconducting oxide (hereinafter referred to as Bi-based superconducting oxide). More particularly, the present invention relates to a process for producing a Bi-based superconducting oxide, which comprises subjecting a starting material for Bi-based superconducting oxide to partial melting and then to crystallization to obtain a Bi-based superconducting oxide.

In recent years, by using a superconducting magnet made of a superconducting oxide having superconducting properties, there have been or are being developed various apparatuses or techniques such as nuclear magnetic resonance (NMR) analyzer, NMR tomograph, levitated train and the like. Further, it is being investigated to apply the strong magnetism of superconducting magnet to development of new energy (e.g. fusion reactor) or new energy conversion techniques (e.g. magnethydrodynamics power generation).

As such a superconducting oxide, there have been studied and developed various superconducting oxides. Of these superconducting materials, Bi-based superconducting oxides of Bi-Sr-Ca-Cu-O type have high critical temperatures (Tc) and are drawing attention.

The Bi-based superconducting oxides are generally produced by mixing starting materials to obtain a starting material powder so as to give a composition showing superconducting properties, molding the powder and firing the molded article.

In order for a sintered article to have superconducting properties and a practical critical current density ($J_c$), it is necessary that the sintered article contain no impurities and the particles in the sintered article are bonded with each other so as to allow the smooth flow of supercurrent.

In the above production process, however, the impurities contained in the starting materials are not decomposed thoroughly and part of them remains in the final sintered article, and although the particles in the sintered article are bonded, the crystal faces are nonuniform and irregular; therefore, the above process is insufficient to obtain a high $J_c$.

There is also proposed a process wherein a starting oxide for Bi-based superconducting material is, after melting, cooled slowly and then crystallized in order to obtain a higher crystallinity. In this process, however, crystal phase other than desired are present together and accordingly no crystal phase of desired composition is formed, making it impossible to obtain a high $J_c$. Further in the process, the time for crystal growth is too long.

Further, a superconducting sintered article causing substantially no shrinkage can be obtained by subjecting a starting material powder for Bi-based superconducting oxide to molding and firing and, in that case, effecting the firing for a long period of time of about 1 month at the melting point of the superconducting oxide or below. However, the $J_c$ of the article is not high and accordingly the article is not satisfactory as a superconducting oxide.

Therefore, the first object of the present invention is to provide a process for producing a Bi-based superconducting oxide superior in superconducting properties (e.g. $J_c$).

The above and other objects of the present invention will become apparent from the following description.

SUMMARY OF THE INVENTION

According to the present invention, there is provided a process for producing a Bi-based superconducting oxide, which comprises:

molding a material powder, and subjecting the molded article to partial melting and then to crystallization, both in the presence of oxygen, to obtain a Bi-based superconducting oxide.

In the above process, it is preferable that the molded article be placed on an Ag substrate and subjected to partial melting at 880°–920° C. and then to crystallization.

According to the present invention, there is also provided a process for producing a Bi-based superconducting oxide, which comprises:

molding a material powder, and subjecting the molded article to partial melting, annealing to the crystallization temperature and crystallization at that temperature.

According to the present invention, there is also provided a process for producing a Bi-based superconducting oxide, which comprises:

molding a material powder, subjecting the molded article to partial melting, annealing the resulting article to the crystallization temperature, subjecting the article to crystallization at that temperature, all in the presence of oxygen, followed by cooling, and heat-treating the cooled article in an inert gas atmosphere.

DETAILED DESCRIPTION OF THE INVENTION

The present invention is described in detail below.

The Bi-based superconducting oxide of the present invention has a typical composition represented by $Bi_2Sr_2CaCu_2O_x$, $Bi_2Sr_2Ca_2Cu_3O_x$ or the like. It can have any composition as long as it can express superconducting properties as the result of partial melting and subsequent crystallization steps. For example, the Bi-based superconducting oxide of the present invention may have a composition obtained by adding Pb, Sb or the like to the above typical composition, a nonstoichiometric composition, a composition obtained by substituting part or all of one major element in the above typical composition with a new element, or the like.

In the present invention, the starting material for Bi-based superconducting oxide is not particularly restricted and can be appropriately selected from, for example, a mixed compound powder obtained by mixing oxides known as ordinary starting materials for Bi-based superconducting oxide, such as $Bi_2O_3$, $SrCO_3$, $CaCO_3$, $CuO$ and the like at given proportions, a powder obtained by calcinating said mixed compound powder, and a vitreous powder (e.g. an amorphous Bi-based frit powder obtained by melting at the melting point or higher and subsequent quenching). A Bi-based frit powder is preferable.

In order to obtain a Bi-based frit powder, a starting material for said powder which has been compounded so as to give a Bi-Sr-Ca-Cu-O type superconducting oxide upon firing, is melted preferably at 1,100°–1,300° C. When the melting temperature is lower than 1,100° C., the melting is insufficient, making it difficult to obtain a uniform melt. When the melting temperature is higher than 1,300° C., the vaporization of the starting material takes place vigorously; the resulting Bi-based frit has a changed and undesirable composition; no superconducting properties may be obtained ultimately, or the starting material may react with the material constituting the crucible used for melting.

The particle diameters of the frit powder used in the present invention, are desired to be as small as possible because smaller particle diameters give a more dense sintered article. However, particles of certain diameter are preferable from the convenience of molding. Hence, particles of 1–20 μm in diameter are preferable.

In the present invention, a starting material powder as mentioned above is molded according to a known method such as dry pressing method, slurry coating method, doctor blade method or the like to prepare a molded article, and the molded article is fired. In this case, the firing of the molded article is effected in the presence of oxygen so as to give rise to the partial melting and crystallization of the molded article.

The firing is effected after placing the molded article on a substrate, or after coating the starting material directly on a substrate of desired shape according to a spray coating or the like. The substrate is preferably an Ag substrate. The Ag substrate includes, for example, a substrate composed of Ag alone and a substrate obtained by forming a thin Ag film of about 1 μm to 1 mm on a metal plate of stainless steel or the like or on a ceramic plate, and can be any substrate as long as a starting material for Bi-based superconducting oxide or a molded article thereof can be mounted on the Ag component of the substrate. In using a substrate having a thin Ag film, if the thickness of the Ag film is less than about 1 μm, there may occur the reaction of the Bi-based superconducting oxide with the main substrate portion underlying the Ag film; if the thickness of the Ag film is more than 1 mm, there occurs no incovenience, but the practically preferable thickness is about 1 mm in view of the cost incurred.

The firing is effected at temperatures of 880°–920° C. in an oxygen atmosphere. When the firing temperature is lower than 880° C., there occurs substantially no melting and the resulting article has no dense structure. When the firing temperature is higher than 920° C., there occurs separation of a liquid phase and a solid phase in the melt, which is not preferable. The firing may be effected in two stages. In the case of two-stage firing, the first stage firing is effected at 880°–920° C. for 1 minute to 3 hours, preferably 5 minutes to 3 hours and the second stage firing is effected at 800°–880° C. for at least 3 hours. It is preferable that in the first stage the starting material or its molded article be subjected to partial melting and in the second stage the partially melted starting material or molded article be subjected to crystallization. When the firing is effected under a lower oxygen partial pressure, the firing temperature is lower. For example, in the firing in the atmosphere, the firing temperature is lower by 10°–20° C. than in the firing in an oxygen atmosphere.

When there is adopted the two-stage firing, annealing is effected, after the first stage firing, i.e. after partial melting, down to the temperature of the second stage firing, i.e. the crystallization temperature of the partially melted article. Specifically, the article after the first firing is annealed from a temperature for partial melting (880°–920° C.) to a temperature for crystallization (800°–880° C.).

The cooling rate during annealing differs by the composition of Bi-based superconducting oxide but is 0.1°–2.0° C./min, preferably 0.2°–1.0° C./min, more preferably 0.5°–1.0° C./min. When the cooling rate is outside the range of 0.1°–2.0° C./min, it is impossible to obtain a Bi-based superconducting oxide having a sufficiently high $J_c$.

The reason why annealing gives a high $J_c$ is not clear but is presumed to be as follows. It is believed that in partial melting, there occurs dissolution of part of the Bi-based superconducting oxide and as a result there appears a solid phase and a liquid phase, and in the subsequent cooling and solidification step, the solid phase and the liquid phase react with each other and as a result there occurs the growth of particles which become a superconducting phase.

In this case, when there is conducted rapid cooling after partial melting, the growth of particles (the particles become a superconducting phase) (this growth takes place most strikingly in the cooling and solidification step) is prohibited; the growth takes place in the subsequent crystallization step as a result of mutual diffusion of the solid phase and the solidified liquid phase; therefore, the crystallization time must be long in order to obtain superconductivity; and the $J_c$ obtained is low. When the cooling after partial melting is conducted too slowly, the state of partial melting lasts long; during the period, the solid phase gives rise to agglomeration, which hinders the uniform reaction of the solid phase and the liquid phase (the reaction generates the growth of particles which become a superconducting phase); and the $J_c$ obtained is low.

Accordingly, the annealing from the partial melting to the crystallization temperature in the present invention must be effected at such a cooling rate that there occurs, during the cooling and solidification step, sufficient growth of particles (which become a superconducting phase) as a result of the reaction of the solid phase and the liquid phase. The above cooling rate range has been found to be preferable in the present invention.

In the present invention, the molded article mounted on an Ag substrate, when subjected to partial melting, gives a Bi-based superconducting oxide of very high $J_c$. This is preferable, but the reason is not clear.

In the present invention, it is possible that the above obtained fired article (superconducting oxide) be further cooled and the cooled article be heat-treated in an inert gas atmosphere to obtain a Bi-based superconducting oxide of high $J_c$.

In this process, the article after crystallization is cooled ordinarily to 200° C. or below at a cooling rate of 5° C./min or less. When the cooling rate is more than 5° C./min, the fired article may have defects such as cracks and the like. Thus, the purpose of cooling to 200° C. or below is to prevent the formation of defects, for example, cracks due to thermal shock.

The above cooling may be effected as above immediately after the completion of annealing from the partial melting temperature to the crystallization temperature, or may be effected after the annealed article has been kept at the crystallization temperature (800°–880° C.) for a given length of time, for example, 1–50 hours. Keeping the annealed article at the crystallization temperature for a given length of time is preferable because it can promote the growth of crystalline particles which become a superconducting phase.

The above obtained cooled article has no defects such as cracks and the like and accordingly good appearance, but has a slightly low $J_c$ and slightly low superconducting properties.

Hence, in the present invention, the cooled article is heat-treated in an inert gas atmosphere. This heat treatment can the cooled article (Bi-based superconducting oxide of relatively low $J_c$) to a Bi-based superconducting oxide of high $J_c$. The reason is not clear but is presumed to be as follows. That is, the partial melting, annealing in an oxygen atmosphere and cooling to 200° C. or below increase the oxygen content in Bi-based superconducting oxide and reduce the superconducting properties of the superconducting oxide; however, in the subsequent heat treatment in an inert gas atmosphere, excessive oxygen is removed from the Bi-based superconducting oxide containing oxygen in an excessive amount, whereby a Bi-based superconducting oxide having excellent superconducting properties can be derived.

The inert gas atmosphere used in the heat treatment can be, for example, a nitrogen atmosphere, a rare gas (e.g. argon) atmosphere or the like. Of them, a nitrogen atmosphere is useful industrially, but the inert gas atmosphere is not particularly restricted as long as the oxygen partial pressure is not more than 0.01 atmosphere.

The heat treatment is effected at temperatures of preferably 300°-600° C. When the heat treatment temperature is lower than 300° C., the removal of excessive oxygen contained in the cooled article can not be done sufficiently. When the temperature is higher than 600° C., the rate of oxygen removal is large; it is impossible to control the oxygen content in Bi-based superconducting oxide at an appropriate level; and there occurs the deterioration of superconducting properties.

The time of heat treatment differs by the heat treatment temperature, the composition of the cooled article, etc. but can be appropriately selected so as to give a Bi-based superconducting oxide having excellent superconducting properties and an appropriate composition. The time is ordinarily 5-20 hours at 300° C. and 1-5 hours at 600° C.

The process comprising the heat treatment of the cooled article in an inert gas atmosphere enables the production of large-sized Bi-based superconducting oxide (e.g. superconducting oxide for magnetic shielding) (such production has hitherto been considered to be almost impossible) and is useful industrially.

The present invention is described in more detail below by way of Examples.

EXAMPLES 1-10

Preparation of Bi-based frit

Powders of $Bi_2O_3$, $SrCO_3$, $CaCO_3$ and $CuO$ were weighed so as to give a molar ratio of Bi:Sr:Ca:Cu = 2.0:2.0:1.0:2.0, and were mixed in a dry mixer for 2 hours. 200 g of the resulting powder was placed in a platinum crucible, the crucible was placed in an electric furnace of 1,200° C. to subject the powder to melting for 30 minutes. The resulting melt was dropped onto stainless steel rollers being rotated under water cooling and passed between the rollers, whereby the melt was compression-quenched.

The resulting granular compression-quenched material showed no peak in the X-ray diffraction pattern, but gave a halo of large half-width and indicated that the material had a molar ratio of Bi:Sr:Ca:Cu = 2:2:1:2 and there occurred no compositional change during the melting.

Next, the granular compression-quenched material was mixed with $ZrO_2$ media in an solvent (isopropyl alcohol), and the mixture was ground by a rotary mill for 15 hours to obtain a frit. The frit had an average particle diameter of 7 $\mu$m.

Molding

The above obtained Bi-based frit as a starting material was press-molded into a plate of 40 mm × 8 mm × 1 mm. The plate-shaped molded article (a) was placed on a substrate of 50 mm × 10 mm × 0.5 mm made of Ag alone.

Separately, the Bi-based frit was dispersed in a solvent (isopropyl alcohol), the particle size was adjusted, the dispersion was spray-coated on a plate of 50 mm × 10 mm × 0.5 mm made of Ag alone by a spray gun, the coated plate was dried to form a molded article (b) on the Ag substrate.

Firing and Measurement of Superconducting Properties

The molded articles (a) and (b) each on the Ag plate were fired in an oxygen gas in an electric furnace. The firing was effected by firstly subjecting each article to partial melting at 880°-920° C. for a given length of time and then to crystallization at 850° C. for 15 hours, as shown in Table 1. The article after the firing was taken out of the furnace and allowed to cool to obtain respective Bi-based superconducting sintered articles.

The sintered articles were measured for critical current density ($J_c$) in liquid nitrogen according to a four-probe method. The results are shown in Table 1.

The surface condition of each sintered article was observed visually. The results are shown in Table 1.

The section of each sintered article after partial melting was examined by an electron probe microanalyzer. It indicated that Ag was uniformly dispersed in the sintered article from the side contacting the Ag plate to the other side.

COMPARATIVE EXAMPLES 1-2

The same molded article (b) as in Example 1 was fired under the firing conditions shown in Table 1. The resulting sintered articles were measured in the same manner as in Example 1. The results are shown in Table 1.

COMPARATIVE EXAMPLES 3-10

The same molded article (b) as in Example 1 was formed on a substrate made of partially stabilized zirconia (PSZ) by spray coating, and then fired by subjecting to partial melting and crystallization in the same manner as in Example 1.

The resulting sintered articles were measured in the same manner as in Example 1. The results are shown in Table 1.

TABLE 1

| | Firing Conditions | | | | | | | | |
|---|---|---|---|---|---|---|---|---|---|
| | Partial melting | | Crystallization | | | | Molded | | Surface |
| | Temp. (°C.) | Time | Temp. (°C.) | Time | Substrate | Powder | article | $J_c$(A/cm$^2$) | condition |
| Example | | | | | | | | | |
| 1 | 880 | 30 min | 850 | 15 hr | Ag | Frit | (b) | 600 | Good |
| 2 | 890 | " | " | " | " | " | " | 900 | " |
| 3 | 900 | " | " | " | " | " | " | 750 | " |
| 4 | 920 | " | " | " | " | " | " | 600 | " |
| 5 | 890 | 5 min | " | " | " | " | (a) | 700 | " |
| 6 | " | 1 hr | " | " | " | " | " | 600 | " |
| 7 | " | 3 hr | " | " | " | " | " | 500 | " |
| 8 | 895 | 1 hr | " | " | " | " | (b) | 800 | " |
| 9 | 895 | 3 hr | " | " | " | " | " | 650 | " |
| 10 | 890 | 1 min | " | " | " | " | (a) | 400 | " |
| Comparative Example | | | | | | | | | |
| 1 | 870 | 30 min | " | " | " | " | (b) | 0 | No shrinkage |
| 2 | 930 | " | " | " | " | " | " | 250 | Good |
| 3 | 900 | 10 min | " | " | PSZ | " | " | 0 | No shrinkage |
| 4 | 905 | " | " | " | " | " | " | 100 | Bulging |
| 5 | 910 | " | " | " | " | " | " | 300 | " |
| 6 | 915 | " | " | " | " | " | " | 300 | " |
| 7 | 920 | " | " | " | " | " | " | 300 | " |
| 8 | 925 | " | " | " | " | " | " | 0 | " |
| 9 | 915 | 3 min | " | " | " | " | " | 200 | " |
| 10 | " | 30 min | " | " | " | " | " | 100 | " |

As is clear from the results of Examples 1-10 and Comparative Examples 1-10, when the Bi-based frit was molded on an Ag substrate and subjected to partial melting at 880°-920° C., each of the sintered articles gave a $J_c$ of 400 A/cm$^2$ or more and had a good surface.

When the same Bi-based frit was molded on a PSZ substrate and fired (Comparative Examples 3-10), the sintered articles gave a highest $J_c$ of 300 A/cm$^2$ when the partial melting temperature was 910°-920° C., and gave surface bulging. Thus, all the sintered articles were unsatisfactory.

EXAMPLES 11-25 AND COMPARATIVE EXAMPLES 11-14

Powders of $Bi_2O_3$, $SrCO_3$, $CaCO_3$ and CuO were wet (water)-mixed so as to give a molar ratio of Bi:Sr:Ca:-Cu=2:2:1:2. The mixed powder was calcinated at 800° C. for 20 hours in the atmosphere. The calcinated powder was placed in a nylon-made container containing methanol and ground together with zirconia media for 1-20 hours to obtain calcinated and ground powders having average particle diameters of 2-7 μm depending upon the grinding time.

Each of the calcinated and ground powders was molded by press molding, doctor blade molding or spray coating molding to obtain rectangular parallelepipeds of 0.5 mm (thickness)× 20 mm×5 mm.

Press molding was effected by using an iron-made mold and a pressure of 1 ton/cm$^2$.

Doctor blade molding was effected by adding to a calcinated and ground powder, 10% by weight of polyvinyl butyral as a binder, 1% by weight of a dispersing agent and 5% by weight of a plasticizer, stirring the mixture in a mixed solvent consisting of equal volumes of toluene and isopropyl alcohol to prepare a slurry, subjecting the slurry to deaeration and viscosity adjustment, molding the resulting slurry with a blade, and drying the molded article at 120° C.

The resulting press-molded articles and doctor blade molded articles were each mounted on an Ag substrate.

Spray coating molding was effected by adding 1% by weight of a dispersing agent to a calcinated and ground powder and spray-coating the mixture on an Ag substrate of 0.5 mm in thickness, in a thickness of about 700 μm using a solvent (ethannol).

The thus obtained molded articles each formed on an Ag substrate were kept in an oxygen atmosphere at 890° C. for 5 minutes to 1 hour depending upon the average particle diameter of the powder used, to give rise to partial melting. The resulting articles were annealed to the respective crystallization temperatures shown in Table 2, at the cooling rates shown in Table 2.

After the annealing, the articles were kept at the crystallization temperatures for 20 hours to effect crystallization. After the crystallization, the articles were taken out of the furnace and quenched to room temperature to obtain Bi-based superconducting oxides.

The Bi-based superconducting oxides were measured for critical current density ($J_c$) at the boiling point of liquid nitrogen according to a four-probe method. The results are shown in Table 2.

As is clear from the results of Examples 11-20 and Comparative Examples 11-12, the Bi-based superconducting materials of Examples 11-20 prepared using doctor blade molding and cooling rates of 0.1°-2.0° C./min (annealing) gave $J_c$'s of 2,500 A/cm$^2$ or more, irrespective of the average particle diameters and the crystallization temperatures, while the Bi-based superconducting oxides of Comparative Examples 11-12 prepared using the same molding but too small a cooling rate or too large a cooling rate gave $J_c$'s of less than 1,000 A/cm$^2$.

The Bi-based superconducting oxides of Examples 21-25 prepared using spray coating molding or press molding and the similar cooling rates (annealing), also gave high $J_c$'s. Meanwhile, the Bi-based superconducting oxide of Comparative Examples 13-14 prepared using the same molding (spray coating molding or press molding) but too small a cooling rate or too large a cooling rate gave $J_c$'s of less than 1,000 A/cm$^2$.

TABLE 2

| | Particle diameter of powder (μm) | Molding method | Melting time (min) | Cooling rate (°C./min) | Crystallization temp. (°C.) | $J_c$ (A/cm$^2$) |
| --- | --- | --- | --- | --- | --- | --- |
| Example | | | | | | |
| 11 | 4 | Doctor blade | 30 | 0.1 | 850 | 2500 |
| 12 | 4 | " | 30 | 0.2 | 850 | 3000 |
| 13 | 4 | " | 30 | 0.5 | 850 | 4000 |
| 14 | 4 | " | 30 | 1.0 | 850 | 4500 |
| 15 | 4 | " | 30 | 2.0 | 850 | 2500 |
| 16 | 2 | " | 5 | 1.0 | 850 | 4000 |
| 17 | 7 | " | 60 | 1.0 | 850 | 3500 |
| 18 | 4 | " | 30 | 1.0 | 750 | 4000 |
| 19 | 4 | " | 30 | 1.0 | 800 | 4500 |
| 20 | 4 | " | 30 | 1.0 | 880 | 4000 |
| 21 | 4 | Spraying | 30 | 0.2 | 850 | 2500 |
| 22 | 4 | " | 30 | 0.5 | 850 | 3500 |
| 23 | 4 | " | 30 | 1.0 | 850 | 4000 |
| 24 | 4 | Pressing | 30 | 1.0 | 850 | 4000 |
| 25 | 4 | " | 30 | 0.5 | 850 | 3500 |
| Comparative Example | | | | | | |
| 11 | 4 | Doctor blade | 30 | 0.05 | 850 | 900 |
| 12 | 4 | " | 30 | 5.0 | 850 | 500 |
| 13 | 4 | Spraying | 30 | 0.05 | 850 | 700 |
| 14 | 4 | " | 30 | 5.0 | 850 | 400 |

EXAMPLES 26-33 AND COMPARATIVE EXAMPLES 15-18

Bi-based superconducting oxide were prepared in the same manner as in Example 11 except that the Ag substrate was changed to a Zirconia substrate and the partial melting was effected at 920° C. for 5-30 minutes. The results are shown in Table 3.

As is clear from the results of Table 3, the Bi-based superconducting oxide of Examples 26-33 prepared using cooling rates of 0.1°-2.0° C./min gave $J_c$'s of 1,500 A/cm$^2$ or more. Meanwhile, the Bi-based superconducting oxides of Comparative Examples 15-18 prepared using cooling rates which were outside the above range, gave $J_c$'s of 500 A/cm$^2$ or less.

TABLE 3

| | Particle diameter of powder (μm) | Molding method | Melting time (min) | Cooling rate (°C./min) | Crystallization temp. (°C.) | $J_c$ (A/cm$^2$) |
| --- | --- | --- | --- | --- | --- | --- |
| Example | | | | | | |
| 26 | 4 | Doctor blade | 5 | 0.1 | 850 | 1800 |
| 27 | 4 | " | 30 | 0.2 | 850 | 2200 |
| 28 | 4 | " | 30 | 0.5 | 850 | 2800 |
| 29 | 4 | " | 30 | 1.0 | 850 | 2500 |
| 30 | 4 | " | 30 | 2.0 | 850 | 2000 |
| 31 | 4 | Spraying | 30 | 0.2 | 850 | 1500 |
| 32 | 4 | " | 30 | 0.5 | 850 | 2500 |
| 33 | 4 | " | 30 | 1.0 | 850 | 2000 |
| Comparative Example | | | | | | |
| 15 | 4 | Doctor blade | 5 | 0.05 | 850 | 500 |
| 16 | 4 | " | 30 | 5.0 | 850 | 250 |
| 17 | 4 | Spraying | 5 | 0.05 | 850 | 450 |
| 18 | 4 | " | 30 | 5.0 | 850 | 200 |

EXAMPLES 34-41 AND COMPARATIVE EXAMPLES 19-20

Starting material powders of Bi$_2$O$_3$, SrCO$_3$, CaCO$_3$ and CuO were wet (water)-mixed so as to give a molar ratio of Bi:Sr:Ca:Cu=2:2:1:2. The mixture was placed in a platinum crucible and melted at 1,200° C. for 30 minutes. The melt was quenched using twin rollers to obtain a flake-like frit.

The frit, together with zirconia media, was ground for 1-3 hours in a solvent (ethanol) using a vibration mill to obtain various powders having average particle diameters of 3-10 μm depending upon the grinding time used. By X-ray diffractometry, the powders were confirmed to be vitreous.

The powders were molded in the same manner as in Example 11. Using the resulting molded articles, there were 20 manner as in Example 11 except that the partial melting time was changed to 5 minutes to 3 hours. The results are shown in Table 4.

The Bi-based superconducting oxides of Examples 34-41 prepared using cooling rates of 0.1°-2.0° C./min gave high $J_c$'s.

TABLE 4

| | Particle diameter of powder (μm) | Molding method | Melting time (min) | Cooling rate (°C./min) | Crystallization temp. (°C.) | $J_c$ (A/cm$^2$) |
| --- | --- | --- | --- | --- | --- | --- |
| Example | | | | | | |

TABLE 4-continued

|    | Particle diameter of powder (μm) | Molding method | Melting time (min) | Cooling rate (°C./min) | Crystallization temp. (°C.) | $J_c$ (A/cm$^2$) |
| --- | --- | --- | --- | --- | --- | --- |
| 34 | 5 | Doctor blade | 30 | 0.1 | 850 | 2800 |
| 35 | 5 | " | 30 | 0.2 | 850 | 3300 |
| 36 | 5 | " | 30 | 0.5 | 850 | 4300 |
| 37 | 5 | " | 30 | 1.0 | 850 | 4800 |
| 38 | 5 | " | 30 | 2.0 | 850 | 3000 |
| 39 | 3 | " | 5 | 1.0 | 850 | 5000 |
| 40 | 7 | " | 60 | 1.0 | 850 | 3500 |
| 41 | 10 | " | 180 | 1.0 | 850 | 3000 |
| Comparative Example | | | | | | |
| 19 | 5 | " | 30 | 0.05 | 850 | 1200 |
| 20 | 5 | " | 30 | 5.0 | 850 | 900 |

EXAMPLE 42–50

Starting material powders of $Bi_2O_3$, $SrCO_3$, $CaCO_3$, and CuO were weighed so as to give a molar ratio of Bi:Sr:Ca:Cu=2:2:1:2, and ground and mixed with distilled water for 16 hours in a ball mill. The water in the resulting mixture was vaporized, the resulting mixture was pelletized to particle diameters of about 100 μm, the resulting powder was calcinated to 800° C. for 10 hours in the atmosphere. The calcinated product was ground to particle diameters of 10 μm or less in a solvent (toluene) in a ball mill to obtain a superconducting oxide powder.

The powder was molded by in-mold pressing to prepare a superconducting oxide molded article having a rectangular parallelepiped shape of 2 mm (thickness)×20 mm×30 mm.

The molded article was fired at 910° C. for 10 minutes in an oxygen atmosphere in an electric furnace, then annealed to 800° C. at a cooling rate of 0.5° C./min in the furnace, and kept therein at 800° C. for 10 hours. Thereafter, the article was cooled to 200° C. at a rate of 3° C./min.

The cooled article was taken out of the electric furnace, and its appearance was examined. There was no crack.

The above obtained cooled article was heat-treated under various conditions (inert gas atmosphere, temperature and time) shown in Table 5 to obtain Bi-based superconducting oxides. A test piece of 1 mm (thickness)×2 mm×20 mm was cut out from each material and measured for critical temperature (Tc) and critical current density ($J_c$) at the boiling temperature of liquid nitrogen. The results are shown in Table 5.

COMPARATIVE EXAMPLES 21–25

The same cooled article as obtained in Examples 42–50 was heat-treated at a high or low temperature in the atmosphere or in an inert gas (nitrogen gas) as shown in Table 5, to obtain Bi-based superconduction oxides.

The results are shown in Table 5.

As is clear from Examples 42–50 and Comparative Examples 21–25, while the Bi-based superconducting oxides of Examples 42–50 and those of Comparative Examples give similar Tc's, the former oxides are far superior to the latter materials in $J_c$.

TABLE 5

| | Heat treating conditions | | | | $J_c$ |
| --- | --- | --- | --- | --- | --- |
| | Atmosphere gas | Temperature (°C.) | Time (hr) | Tc (K) | (A/cm$^2$) |
| Example | | | | | |
| 42 | Nitrogen | 400 | 7 | 87 | 770 |
| 43 | " | 500 | 5 | 88 | 810 |
| 44 | " | 600 | 5 | 86 | 660 |
| 45 | " | 450 | 10 | 87 | 780 |
| 46 | Argon | 500 | 3 | 88 | 830 |
| 47 | " | 600 | 3 | 87 | 630 |
| 48 | Nitrogen | 300 | 15 | 86 | 500 |
| 49 | " | 550 | 5 | 88 | 860 |
| 50 | " | 350 | 15 | 86 | 690 |
| Comparative Example | | | | | |
| 21 | — | — | — | 85 | 20 |
| 22 | Air | 500 | 5 | 85 | 50 |
| 23 | Nitrogen | 750 | 3 | 84 | 10 |
| 24 | Air | 450 | 10 | 85 | 80 |
| 25 | Nitrogen | 200 | 20 | 85 | 10 |

EXAMPLE 51

A superconducting oxide powder was obtained in the same manner as in Example 42. The powder was molded by sheet molding to obtain a plate-like molded article of 1 mm (thickness)×300 mm×300 mm.

The molded article was fired at 900° C. for 30 minutes in an oxygen atmosphere in an electric furnace, then annealed to 800° C. at a cooling rate of 1.0° C./min in the furnace, and kept at 800° C. for 10 minutes. Thereafter, the article was cooled to room temperature at a rate of 2° C./min.

The cooled article was taken out of the electric furnace, and its appearance was examined. There was no crack.

The cooled article was heat-treated at 500° C. for 6 hours in a hitrogen atmosphere to obtain a Bi-based superconducting plate. This plate had no defects such as crack and the like.

A test piece of 0.7 mm (thickness)×2 mm×20 mm was cut out from the above Bi-based superconducting plate, and measured for Tc and $J_c$ at the boiling temperature of liquid nitrogen. The results were 87K (Tc) and 960 A/cm$^2$ ($J_c$), and the plate had good superconducting properties.

COMPARATIVE EXAMPLE 26

The same plate-like molded article as obtained in Example 51 was fired at 900° C. for 30 minutes in an oxygen atmosphere in an electric furnace, then annealed to 800° C. at a cooling rate of 1.0° C./min in the furnace, and kept at 800° C. for 10 hours. Thereafter, the article was taken out of the furnace and quenched. The quenched article had three large cracks.

What is claimed is:

1. A process for producing a Bi-based superconducting oxide, which comprises:
   molding a material powder comprising a Bi-based frit into a molded article, and
   subjecting the molded article to partial melting at 880°-920° C. for 1 minute to 3 hours and then crystallizing at 750°-880° C., both on an Ag-substrate and in the presence of oxygen to obtain (a) a Bi-based superconducting oxide represented by a molar ratio of Bi:Sr:Ca:Cu of 2:2:1:2 or (b) a superconducting oxide having a crystal structure similar to that of the superconducting oxide (a) obtained by substituting part of one of the main elements in the superconducting oxide (a) with a new element or by adding a new element to the superconducting oxide (a).

2. A process according to claim 1, wherein the molded article is annealed at a cooling rate of 0.1°-2.0° C./minute after the partial melting to the crystallization temperature of 750°-880° C.

3. A process for producing a Bi-based superconducting material, which comprises:
   molding a material powder into a molded article,
   subjecting the molded article to partial melting at 880°-920° C. for 1 minute to 3 hours, annealing the resulting article at a cooling rate of 0.1°-2.0° C./minute to a crystallization temperature of 750°-880° C. and then crystallizing at the crystallization temperature, all in the presence of oxygen, to obtain (a) a Bi-based superconducting oxide represented by a molar ratio of Bi:Sr:Ca:Cu of 2:2:1:2 or (b) a superconducting oxide having a crystal structure similar to that of the superconducting oxide (a), obtained by substituting part of one of the main elements in the superconducting oxide with a new element or by adding a new element to the superconducting oxide (a).

4. A process according to claim 3, wherein crystallization is followed by cooling in the presence of oxygen and then the cooled article is heat treated at 300°-600° C. in an inert atmosphere.

5. A process according to claim 4, wherein the cooling following crystallization is effected at a cooling rate of 5° C./min or less.

6. A process according to claim 3 or 4, wherein the partial melting, the annealing, the crystallization and the cooling steps are effected on an Ag-substrate.

* * * * *